US011828791B2

(12) United States Patent
Song et al.

(10) Patent No.: US 11,828,791 B2
(45) Date of Patent: Nov. 28, 2023

(54) TEST BOARD AND TEST APPARATUS INCLUDING THE SAME

(71) Applicant: Samsung Electronics Co., Ltd., Suwon-si (KR)

(72) Inventors: Kijae Song, Goyang-si (KR); Jongkook Kim, Asan-si (KR); Dongho Lee, Asan-si (KR); Seonmi Lee, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 52 days.

(21) Appl. No.: 17/549,005

(22) Filed: Dec. 13, 2021

(65) Prior Publication Data
US 2022/0365132 A1 Nov. 17, 2022

(30) Foreign Application Priority Data

May 14, 2021 (KR) .................. 10-2021-0062817

(51) Int. Cl.
*G01R 31/28* (2006.01)
*G01R 1/04* (2006.01)

(52) U.S. Cl.
CPC ....... *G01R 31/2863* (2013.01); *G01R 1/0441* (2013.01); *G01R 1/0491* (2013.01); *G01R 31/2889* (2013.01)

(58) Field of Classification Search
CPC .......... G01R 31/2863; G01R 31/31905; G01R 1/0408–0491; G01R 31/2889; G01R 31/2886; G01R 1/0433; G01R 1/07378; G01R 1/0441; G01R 1/0491; H05K 1/144
See application file for complete search history.

(56) References Cited

U.S. PATENT DOCUMENTS

| | | | |
|---|---|---|---|
| 4,080,026 A | 3/1978 | Gianni | |
| 4,192,656 A | 3/1980 | Worrell et al. | |
| 6,084,780 A * | 7/2000 | Happoya | H05K 1/141 361/767 |
| 6,700,398 B1 * | 3/2004 | Co | G11C 29/48 324/759.02 |
| 6,737,738 B2 * | 5/2004 | Koh | G11C 5/04 257/730 |
| 6,777,924 B2 * | 8/2004 | Flach | G01R 31/2853 324/762.01 |
| 6,917,525 B2 | 7/2005 | Mok et al. | |
| 6,994,569 B2 | 2/2006 | Minich et al. | |
| 7,102,892 B2 * | 9/2006 | Kledzik | H05K 1/14 438/109 |

(Continued)

*Primary Examiner* — Judy Nguyen
*Assistant Examiner* — James Split
(74) *Attorney, Agent, or Firm* — Harness, Dickey & Pierce, P.L.C.

(57) ABSTRACT

A test board for testing a semiconductor apparatus includes a first board configured to support a plurality of first Devices Under Test (DUTs) such that the plurality of first DUTs are mounted on the first board, a plurality of first inter-board connectors arranged on the first board, and a plurality of second boards stacked on the first board through the plurality of first inter-board connectors, each second board of the plurality of second boards having a surface configured to support a separate second DUT of a plurality of second DUTs such that the plurality of second DUTs are mounted on separate, respective second boards of the plurality of second board.

19 Claims, 11 Drawing Sheets

(56) References Cited

U.S. PATENT DOCUMENTS

| | | |
|---|---|---|
| 7,114,976 B2 | 10/2006 | Cram |
| 7,256,490 B2 | 8/2007 | Farnworth et al. |
| 7,342,409 B2 | 3/2008 | Farnworth et al. |
| 7,365,416 B2 | 4/2008 | Kawabata et al. |
| 7,394,268 B2 | 7/2008 | Bertin et al. |
| 8,124,429 B2 | 2/2012 | Norman |
| 9,759,741 B2 * | 9/2017 | Park .................. G01R 1/0408 |
| 2003/0074611 A1 | 4/2003 | Nachumovsky |
| 2005/0115062 A1 * | 6/2005 | Lien .................. H01L 23/49861 |
| | | 29/739 |
| 2005/0237073 A1 | 10/2005 | Miller et al. |
| 2020/0379035 A1 * | 12/2020 | Yun .................. G01R 31/2867 |

* cited by examiner

FIG. 4
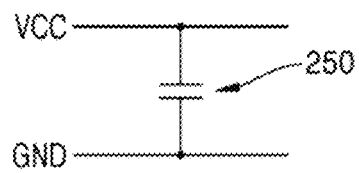
FIG. 5A
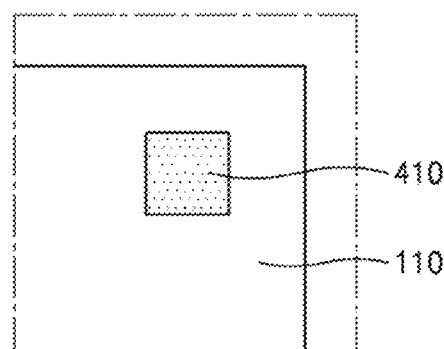
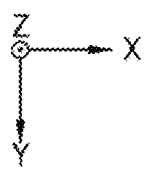
FIG. 5B
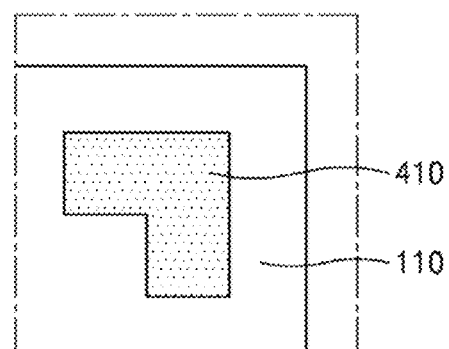
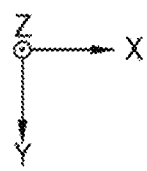

TEST BOARD AND TEST APPARATUS INCLUDING THE SAME

CROSS-REFERENCE TO RELATED APPLICATION

This application is based on and claims priority under 35 U.S.C. § 119 to Korean Patent Application No. 10-2021-0062817, filed on May 14, 2021, in the Korean Intellectual Property Office, the disclosure of which is incorporated by reference herein in its entirety.

BACKGROUND

The inventive concepts relate to a test board and a test apparatus including the same.

A test board receives a test signal from test facilities for generating and transmitting a test signal and transmits the test signal to a Device Under Test (DUT) mounted on the test board. On the test board, tens to hundreds of DUTs are mounted. During a test process, test signals may be simultaneously transmitted to tens to hundreds of DUTs mounted on the test board, and tests may be simultaneously conducted on tens to hundreds of DUTs mounted on the test board.

SUMMARY

Some example embodiments of the inventive concepts provide a test board capable of improving the productivity of a test process regarding Devices Under Test (DUTs).

Some example embodiments of the inventive concepts provide a test apparatus including the above test board.

The technical problems of the inventive concepts are not limited to the above-described description, and other technical problems may be clearly understood by one of ordinary skill in the art from example embodiments to be described hereinafter.

According to example embodiments of the inventive concepts, a test board for testing a semiconductor apparatus may include a first board configured to support a plurality of first Devices Under Test (DUTs) such that the plurality of first DUTs are mounted on the first board, a plurality of first inter-board connectors on the first board, and a plurality of second boards stacked on the first board through the plurality of first inter-board connectors, each second board of the plurality of second boards having a surface configured to support a separate second DUT of a plurality of second DUTs such that the plurality of second DUTs are mounted on separate, respective second boards of the plurality of second boards.

According to some example embodiments of the inventive concepts, a test apparatus may include a test chamber, a test board mounted on the test chamber, the test board configured to support a plurality of semiconductor apparatuses as a plurality of Devices Under Test (DUTs) such that the plurality of DUTs are mounted on the test board, and a tester configured to transmit a test signal to the test board, wherein the test board includes a first board configured to support a plurality of first DUTs such that the plurality of first DUTs are mounted on the first board, a second board stacked on the first board and configured to support a second DUT such that the second DUT is mounted on the second board, and a first inter-board connector configured to electrically connect the first board to the second board.

According to some example embodiments of the inventive concepts, a test apparatus may include a test board mounted on the test chamber and configured to support a plurality of semiconductor apparatuses as a plurality of Devices Under Test (DUTs) such that the plurality of DUTs are mounted on the test board, and a tester configured to transmit a test signal to the test board, wherein the test board includes a first board including a first test substrate, a plurality of first sockets connected to the first test substrate and each configured to accommodate a separate first DUT of a plurality of first DUTs, and an external connector connected to the first test substrate, a plurality of second boards stacked on the first board, and each of the plurality of second boards including a second test substrate, a second socket connected to the second test substrate and configured to accommodate a second DUT, and a decoupling capacitor mounted on the second test substrate, a plurality of inter-board connectors configured to electrically connect the first board to the plurality of second boards and each including a lower connector coupled to the first test substrate and an upper connector coupled to one second test substrate, and the first test substrate includes a first conductive layer, a first connection pad connected to the lower connector, a first conductive via configured to connect the first conductive layer to the first connection pad, a second connection pad connected to a socket pin of any one of the plurality of first sockets, and a second conductive via configured to connect the first conductive layer to the second connection pad, and the second test substrate includes a second conductive layer, a third connection pad connected to the upper connector, a third conductive via configured to connect the second conductive layer to the third connection pad, a fourth connection pad connected to a socket pin of the second socket, and a fourth conductive via configured to connect the second conductive layer to the fourth connection pad.

BRIEF DESCRIPTION OF THE DRAWINGS

Example embodiments of the inventive concepts will be more clearly understood from the following detailed description taken in conjunction with the accompanying drawings in which:

FIG. 4 illustrates an equivalent circuit of a decoupling capacitor mounted on a second test substrate of the test board of FIG. 1A;

FIGS. 5A and 5B each are a plan view of a first inter-board connector of the test board of FIG. 1A;

DETAILED DESCRIPTION

Figure 1A:
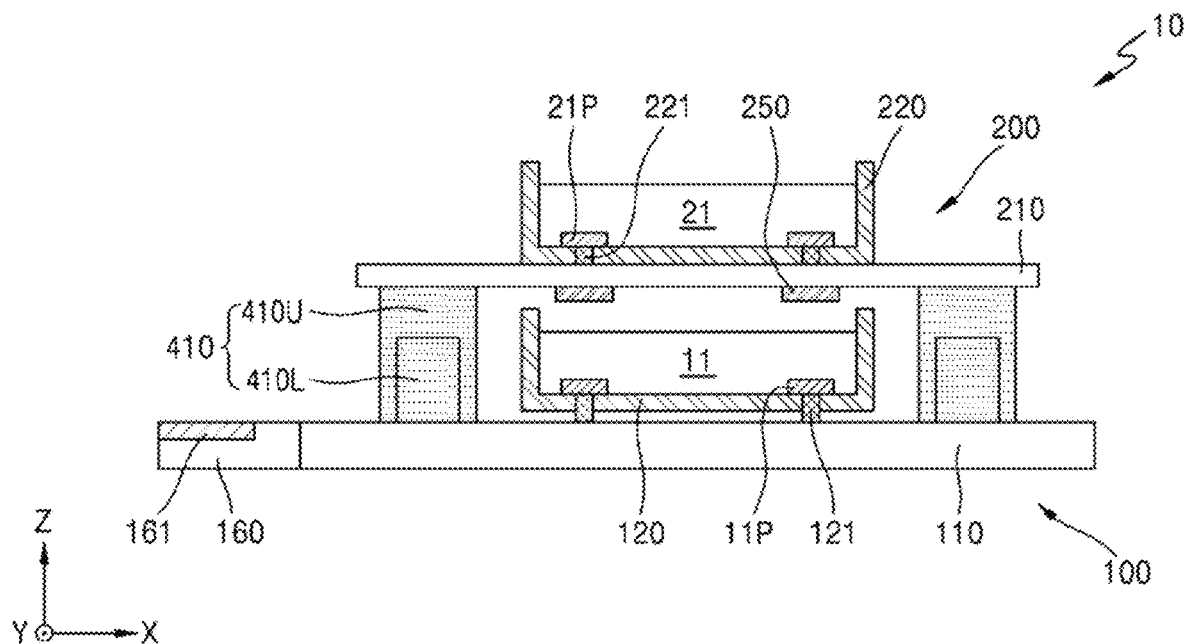
FIGS. 1A and 1B are cross-sectional views of a test board, according to example embodiments.

Hereinafter, example embodiments of the inventive concepts will be described in detail with reference to the attached drawings. Like reference numerals in the drawings denote like elements, and repeated descriptions thereof are omitted.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," "planar," "flat," or the like with regard to other elements and/or properties thereof (e.g., structures, surfaces, directions, or the like) may be "perpendicular," "parallel," "coplanar," "planar," "flat" or the like or may be "substantially perpendicular," "substantially parallel," "substantially coplanar," "substantially planar," "substantially flat," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

Elements and/or properties thereof (e.g., structures, surfaces, directions, or the like) that are "substantially planar" will be understood to be "planar" within manufacturing tolerances and/or material tolerances and/or have a deviation in magnitude and/or angle from "planar," or the like that is equal to or less than 10% (e.g., a. tolerance of ±10%)).

Elements and/or properties thereof (e.g., structures, surfaces, directions, or the like) that are "substantially flat" will be understood to be "flat" thereof within manufacturing tolerances and/or material tolerances and/or have a deviation in magnitude and/or angle from "flat" that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1B:
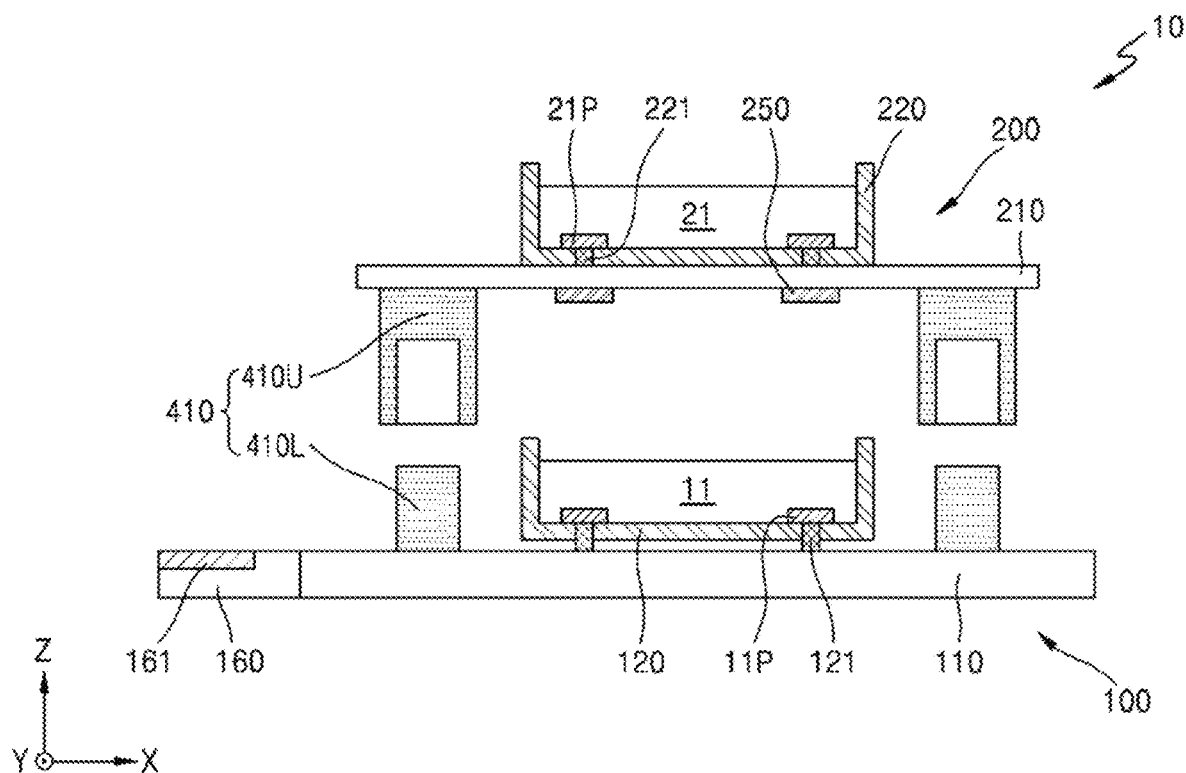

FIGS. 1A and 1B are cross-sectional views of a test board 10 according to example embodiments. FIG. 1A is a cross-sectional view illustrating a state in which a first board 100 of the test board 10 is combined with a second board 200, and FIG. 1B is a cross-sectional view illustrating a state in which the first board 100 of the test board 10 is separated from the second board 200.

Figure 2:
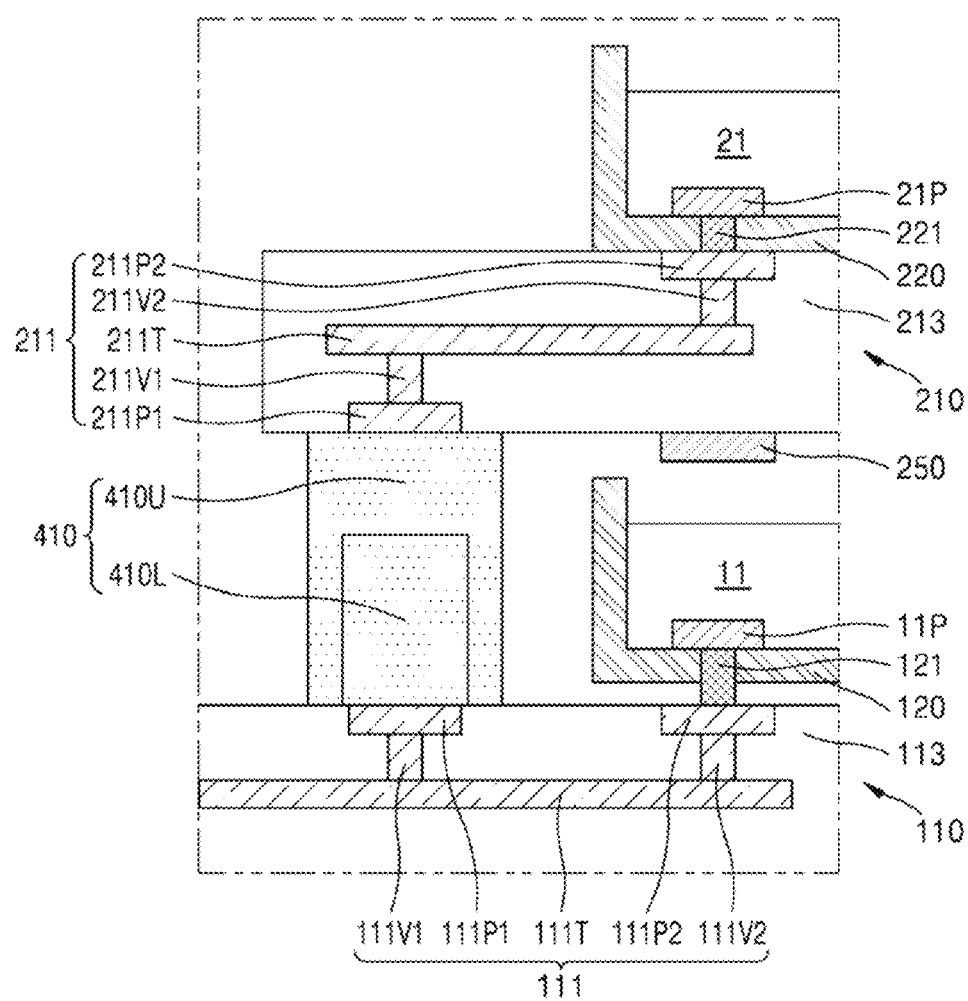
FIG. 2 is a cross-sectional view illustrating part of the test board of FIG. 1A.

FIG. 2 is a cross-sectional view illustrating part of the test board 10 of FIG. 1A.

Referring to FIGS. 1A to 2, the test board 10 may be electrically connected to a tester (1100 of FIG. 3) configured to generate and transmit test signals and may be configured to transmit electrical signals between the tester 1100 and a Device Under Test (DUT).

In the present embodiments, the DUT mounted on the test board 10 may include a semiconductor apparatus manufactured according to a semiconductor manufacturing process. The DUT may include various semiconductor apparatuses including data input/output terminals.

In example embodiments, the DUT may include a memory semiconductor apparatus that includes a memory device including a memory cell array. For example, the memory device may be Double Data Rate Synchronous Dynamic Random Access Memory (DDR SDRAM), Low Power Double Data Rate (LPDDR) SDRAM, a Graphics Double Data Rate (GDDR) SDRAM, or Rambus Dynamic Random Access Memory (RDRAM). Alternatively, the memory device may be non-volatile memory such as flash memory, Magnetic RAM (MRAM), Ferroelectric RAM (FRAM), Phase change RAM (PRAM), or Resistive RAM (RRAM). In example embodiments, the DUT may include a non-memory semiconductor apparatus such as a microprocessor, a controller, or a logic circuit. In example embodiments, the DUT may include a system semiconductor apparatus such as a system large scale integration (LSI) in which a logic circuit is integrated with a memory circuit.

In example embodiments, the DUT may be a semiconductor die in which a semiconductor wafer, on which the semiconductor device is formed, is divided through a dicing process, or a semiconductor package manufactured through a packaging process for the semiconductor die. Alternatively, the DUT may be a semiconductor apparatus including a wafer and the semiconductor device formed on the wafer.

The test board 10 may include the first board 100 on which a first DUT 11 is mounted, the second board 200 on which a second DUT 21 is mounted, and a first inter-board connector 410 that electrically connects the first board 100 to the second board 200. The first board 100 may be understood to be configured to couple with and/or support (e.g., structurally support, support a structural load and/or weight of, accommodate, mount, etc.) the first DUT 11 such that the first DUT 11 is mounted on the first board 100. The second board 200 may be understood to be configured to couple with and/or support (e.g., structurally support, support a structural load and/or weight of, accommodate, mount, etc.) the second DUT 21 such that the second DUT 21 is mounted on the second board 200. As shown, a plurality of first inter-board connectors 410 may be on the first board 100, and the second board 200 may be stacked on the first board 100 (e.g., in the Z direction) through the plurality of first inter-board connectors 410.

The first board 100 may include a first test substrate 110, a first socket 120, and an external connector 160.

The first test substrate 110 may be planar or substantially planar. At least one first DUT 11 may be arranged on a surface of the first test substrate 110. FIGS. 1A and 1B illustrate that one first DUT 11 is mounted on the first test substrate 110, but two or more first DUTs 11 may be mounted on the first test substrate 110. For example, tens to hundreds of first DUTs 11 may be mounted on the first test substrate 110.

The first test substrate 110 may include a Printed Circuit Board (PCB). In more detail, the first test substrate 110 may include a substrate base 113 including an insulating material and a first interconnect pattern 111 including a conductive material and provided in the substrate base 113. For example, the substrate base 113 may include at least one material selected from phenol resin, epoxy resin, and polyimide. For example, the first interconnect pattern 111 may include at least one material selected from copper, nickel, stainless steel, and beryllium copper. In example embodiments, the first interconnect pattern 111 may be formed only in any one of an upper surface or a lower surface of the substrate base 113. In example embodiments, the first interconnect pattern 111 may have a multilayered structure in which conductive layers at different levels in a vertical direction are connected through a conductive via.

The external connector 160 may be on one side of the first test substrate 110. The external connector 160 may be coupled to one edge of the first test substrate 110. The external connector 160 may be a portion inserted into a socket included in an external test chamber (1200 of FIG. 12). A signal from the tester 1100 may be transmitted to the test board 10 through the external connector 160, and an output signal generated from the test board 10 may be transmitted to the tester 1100 through the external connector 160. The external connector 160 may be configured to electrically connect the external tester 1100 to the first test substrate 110. The external connector 160 may include a plurality of pins 161 including conductive materials.

The first socket 120 may be mounted on the first test substrate 110. The first socket 120 may accommodate and support the first DUT 11. The first DUT 11 may be separably mounted on the first socket 120. The first socket 120 may electrically connect the first DUT 11 to the first test substrate 110. The first socket 120 may include a first socket pin 121 electrically connecting a first connection pin 11P of the first DUT 11 to the first interconnect pattern 111 of the first test substrate 110.

The first socket 120 may have a structure appropriate to accommodate the first DUT 11. For example, the structure of the first socket 120 may be determined according to a structure of a semiconductor apparatus corresponding to the first DUT 11. For example, the semiconductor apparatus may have any one of structures such as a Ball grid array (BGA), a Plastic Leaded Chip Carrier (PLCC), a Plastic Dual In-Line Package (PDIP), a Ceramic Dual In-Line Package (CERDIP), a Plastic MetricQuad Flatpack (MQFP), a Thin Quad Flatpack (TQFP), a Small Outline Integrated Circuit (SOIC), a Shrink Small Outline Package (S SOP), a Thin Small Outline Package (TSOP), and/or a Thin Quad Flatpack (TQFP), and the first socket 120 may have a structure appropriate to mount such a semiconductor device thereon. Alternatively, the first socket 120 may include a universal socket on which semiconductor apparatuses having various structures may be mounted.

The second board 200 may be mounted on the first board 100 through the first inter-board connector 410. At least one second DUT 21 may be mounted on the second board 200. FIGS. 1A and 1B illustrate that one second DUT 21 is mounted on the second board 200, but two or more second DUTs 21 may be mounted on the second board 200. In example embodiments, the number (e.g., quantity) of second DUTs 21 mounted on the second board 200 may be the same as (e.g., identical to) the number (e.g., quantity) of first DUTs 11 mounted in an area of the first board 100 that overlaps the second board 200.

The second board 200 may include a second test substrate 210 and a second socket 220.

The second test substrate 210 may be planar or substantially planar. At least one second DUT 21 may be arranged on a surface of the second test substrate 210. The second test substrate 210 may be electrically connected to the first test substrate 110 through the first inter-board connector 410. The second test substrate 210 may be stacked on the first test substrate 110 to cover the first socket 120 and the first DUT 11 arranged on the first test substrate 110.

The second test substrate 210 may include a PCB. In more detail, the second test substrate 210 may include a substrate base 213 including an insulating material and a second interconnect pattern 211 including a conductive material and included in the substrate base 213. In example embodiments, the second interconnect pattern 211 may have a multilayered structure in which conductive layers at different levels in a vertical direction are connected to each other through a conductive via.

The second socket 220 may be mounted on the second test substrate 210. The second socket 220 may accommodate and support the second DUT 21. The second DUT 21 may be separably mounted on the second socket 220. The second socket 220 may electrically connect the second DUT 21 to the second test substrate 210. The second socket 220 may include a second socket pin 221 configured to electrically connect a second connection pin 21P of the second DUT 21 to the second interconnect pattern 211 of the second test substrate 210. The second socket 220 may have a structure appropriate to mount thereon a semiconductor apparatus corresponding to the second DUT 21. The semiconductor apparatus corresponding to the second DUT 21 may have a structure that is the same or substantially the same as or similar to that of the semiconductor apparatus corresponding to the first DUT 11, and a structure of the second socket 220 may be the same or substantially the same as or similar to that of the first socket 120.

The first inter-board connector 410 may be arranged between the first test substrate 110 and the second test substrate 210. The first inter-board connector 410 may have a lower portion connected to the first test substrate 110 and an upper portion connected to the second test substrate 210. The first inter-board connector 410 may electrically connect the second board 200 to the first board 100 and may support the second board 200 to stably stack the second board 200 on the first board 100. The second board 200 may be supported by two or more first inter-board connectors 410. The second board 200 may be stacked on the first board 100 through two or more first inter-board connectors 410.

The first inter-board connector 410 may include a lower connector 410L (also referred to herein as a first lower connector) coupled to the first test substrate 110 (and thus coupled to the first board 100) and an upper connector 410U coupled to the second test substrate 210 (and thus coupled to the second board 200). The lower connector 410L and the upper connector 410U may be separably coupled to each other. When the lower connector 410L and the upper connector 410U are separated from each other, the second board 200 may be separated from the first board 100. When the lower connector 410L and the upper connector 410U are coupled to each other, the second board 200 may be coupled to the first board 100.

In example embodiments, the upper connector 410U may include a groove in which at least a portion of the lower connector 410L may be inserted. In this case, as at least a portion of the lower connector 410L is inserted into the groove of the upper connector 410U, the lower connector 410L and the upper connector 410U are coupled to each other.

In other example embodiments, the lower connector 410L may include a groove in which at least a portion of the upper connector 410U may be inserted. In this case, as at least a portion of the upper connector 410U is inserted into the groove of the lower connector 410L, the lower connector 410L and the upper connector 410U may be coupled to each other.

The first inter-board connector 410 may include conductive lines electrically connecting the first interconnect pattern 111 of the first test substrate 110 to the second interconnect pattern 211 of the second test substrate 210. For example, the lower connector 410L may include a lower conductive line connected to the first interconnect pattern 111 of the first test substrate 110, and the upper connector 410U may include an upper conductive line connected to the second interconnect pattern 211 of the second test substrate 210. The lower conductive line of the lower connector 410L and the upper conductive line of the upper connector 410U may be electrically connected to each other when the lower connector 410L is coupled to the upper connector 410U.

Figure 3:
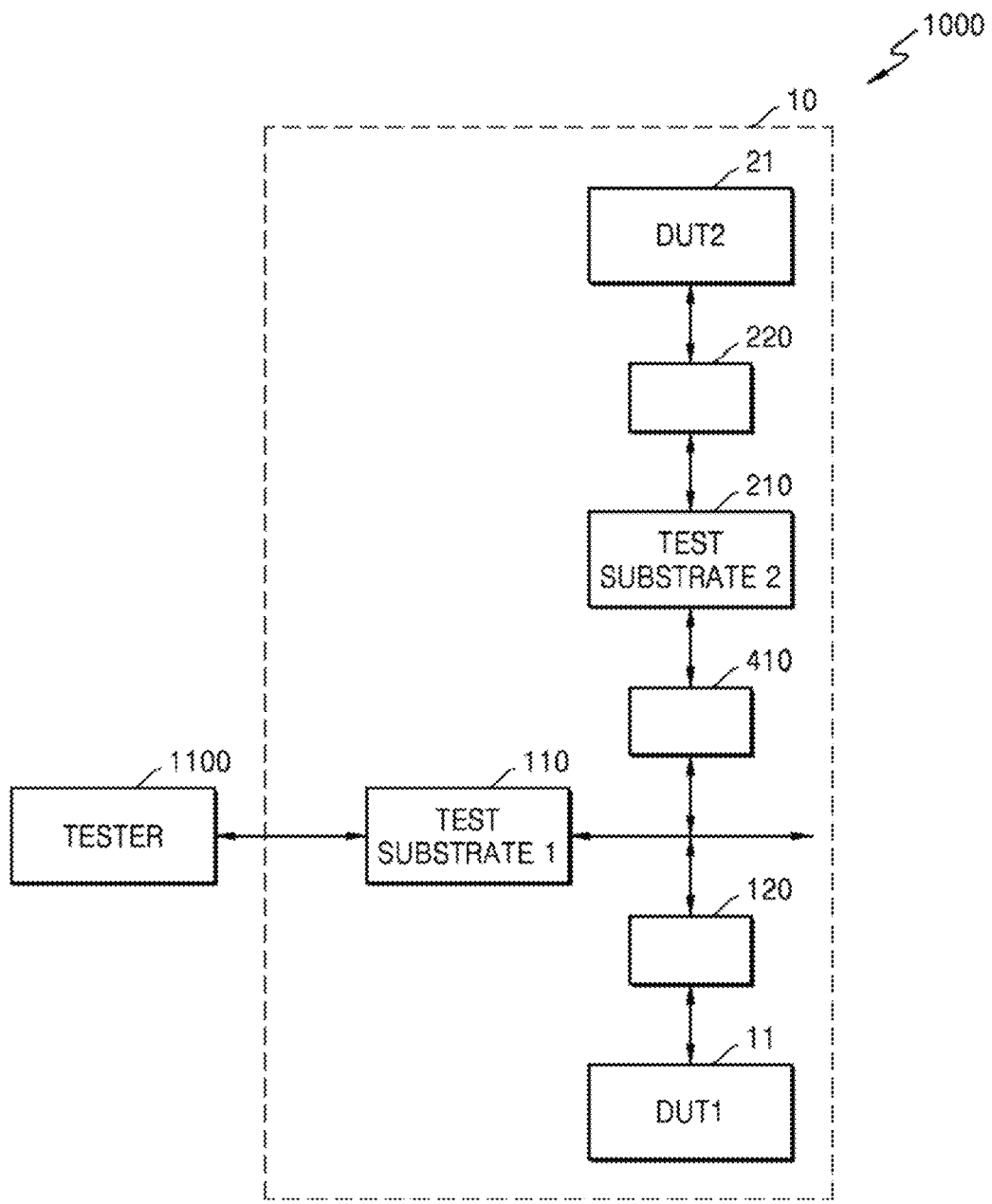
FIG. 3 is a block diagram of a test apparatus including the test board of FIG. 1A.

FIG. 3 is a block diagram of a test apparatus 1000 including the test board 10 of FIG. 1A.

Referring to FIGS. 1A to 3, test signals from the tester 1100 may be transmitted to the first DUT 11 and the second DUT 21 through the test board 10 to test the first DUT 11 and the second DUT 21 mounted on the test board 10. The test signals may include an address signal, a data signal, a command signal, etc. Also, a power signal and a ground signal provided from the tester 1100 may be provided to the first DUT 11 and the second DUT 21 through the test board 10.

The tests on the first DUT 11 and the second DUT 21 may include, for example, a burn-in test, a direct current (DC) test, an alternating current (AC) test, a function test, etc. In detail, the burn-in test is performed to check how much the first DUT 11 and the second DUT 21 may endure thermal stress when electrical signals are transmitted to the first DUT 11 and the second DUT 21 to operate the same. During the DC test, after an analog signal of which a voltage or a current is constant is input to the first DUT 11 and the second DUT 21, an output current for the input voltage or an output voltage for the input current may be measured. During the AC test, after an analog signal of which a voltage mainly changes is input to the first DUT 11 and the second DUT 21, a point in time when a measurement signal changes with respect to a reference signal may be measured. During the function test, after a variable digital signal is input to the first DUT 11 and the second DUT 21, the occurrence of a logic error may be determined.

The test signals from the tester 1100 may be provided to the first DUT 11 and the second DUT 21 through the test board 10 in the same or substantially the same period of time. The test board 10 may include an input signal transmission path, through which test signals input through the external connector 160 are respectively transmitted to the first DUT 11 and the second DUT 21, and an output signal transmission path, through which signals output from the first DUT 11 and the second DUT 21 are transmitted to the external connector 160.

In example embodiments, the first interconnect pattern 111 of the first test substrate 110 may include a first conductive layer 111T, a first connection pad 111P1 connected to the first inter-board connector 410 (e.g., the lower connector 410L of the first inter-board connector 410), a second connection pad 111P2 connected to the first socket pin 121 of the first socket 120, a first conductive via 111V1 connecting the first conductive layer 111T to the first connection pad 111P1, and a second conductive via 111V2 connecting the first conductive layer 111T to the second connection pad 111P2. In example embodiments, the second interconnect pattern 211 of the second test substrate 210 may include a second conductive layer 211T, a third connection pad 211P1 connected to the first inter-board connector 410 (e.g., the upper connector 410U of the first inter-board connector 410), a fourth connection pad 211P2 connected to the second socket pin 221 of the second socket 220, a third conductive via 211V1 connecting the second conductive layer 211T to the third connection pad 211P1, and a fourth conductive via 211V2 connecting the second conductive layer 211T to the fourth connection pad 211P2. In this case, the test signals provided through the external connector 160 may be transmitted to the first DUT 11 through the first interconnect pattern 111 of the first test substrate 110 and may also be transmitted to the second DUT 21 through the first interconnect pattern 111 of the first test substrate 110, the first inter-board connector 410, and the second interconnect pattern 211 of the second test substrate 210.

In example embodiments, the first connection pin 11P of the first DUT 11 and the second connection pin 21P of the second DUT 21 are pins having the same features, and while a test is conducted, the first connection pin 11P and the second connection pin 21P may be configured to receive test signals of the same type through the test board 10. For example, the first connection pin 11P of the first DUT 11 and the second connection pin 21P of the second DUT 21 may be pins having the same features and configured to receive an address signal, a data signal, a command signal, and the like. For example, the first connection pin 11P of the first DUT 11 and the second connection pin 21P of the second DUT 21 may be pins having the same features and configured to receive a signal corresponding to any one of a power signal or a ground signal.

The first connection pin 11P of the first DUT 11 and the second connection pin 21P of the second DUT 21 may be electrically connected to each other through the signal transmission path included in the test board 10. For example, the first connection pin 11P of the first DUT 11 and the second connection pin 21P of the second DUT 21 may be electrically connected to each other through the first socket pin 121 of the first socket 120, the first interconnect pattern 111, the first inter-board connector 410, the second interconnect pattern 211, and the second socket pin 221 of the second socket 220. In this case, the test signals provided from the external connector 160 may be transmitted to the first connection pin 11P of the first DUT 11 through the signal transmission path via the first conductive layer 111T, the second conductive via 111V2, the second connection pad 111P2, and the first socket pin 121 and may also be transmitted to the second connection pin 21P of the second DUT 21 through the signal transmission path via the first conductive layer 111T, the first conductive via 111V1, the first connection pad 111P1, the first inter-board connector 410, the second interconnect pattern 211, and the second socket pin 221.

FIG. 4 illustrates an equivalent circuit of a decoupling capacitor 250 mounted on the second test substrate 210 of the test board 10 of FIG. 1A.

Referring to FIGS. 1A and 4, the second test substrate 210 of the test board 10 may include the decoupling capacitor 250. As illustrated in FIG. 1A, the decoupling capacitor 250 may be mounted on a lower surface of the second test substrate 210 that is opposite to an upper surface of the second test substrate 210 on which the second DUT 21 is mounted. In other example embodiments, the decoupling capacitor 250 may be mounted on the upper surface of the second test substrate 210. The decoupling capacitor 250 may be connected to a conductive layer of the second test substrate 210 through a conductive via thereof. The decoupling capacitor 250 may be arranged between the conductive layer of the second test substrate 210 configured to transmit a power voltage VCC to the second DUT 21, and another conductive layer of the second test substrate 210 configured to transmit a ground voltage GND to the second DUT 21. The decoupling capacitor 250 may remove noise components of the power voltage VCC provided to the second DUT 21.

FIGS. 5A and 5B each are a plan view of the first inter-board connector 410 of the test board 10 of FIG. 1A.

Referring to FIGS. 1A, 2, and 5A, the first inter-board connector 410 may have a pillar shape. For example, on a plan view, the first inter-board connector 410 may have a polygonal shape such as a square shape or a circular shape.

Referring to FIGS. 1A, 2, and 5B, the first inter-board connector 410 may be bent on the plan view. For example, the first inter-board connector 410 may include a first portion extending along a first edge of the first test substrate 110 and a second portion extending along a second edge that is adjacent to the first edge of the first test substrate 110.

Figure 6:
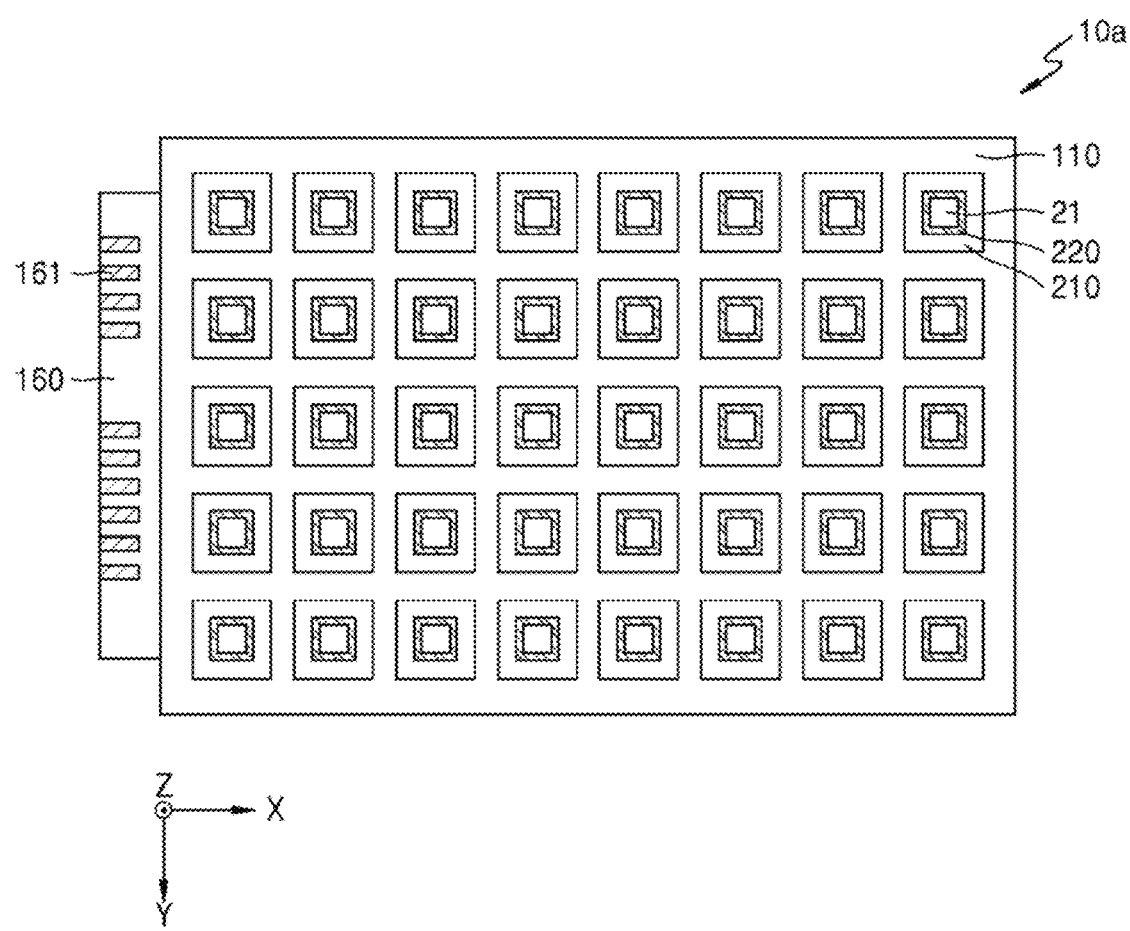
FIG. 6 is a plan view of a test board according to example embodiments.
Figure 7:
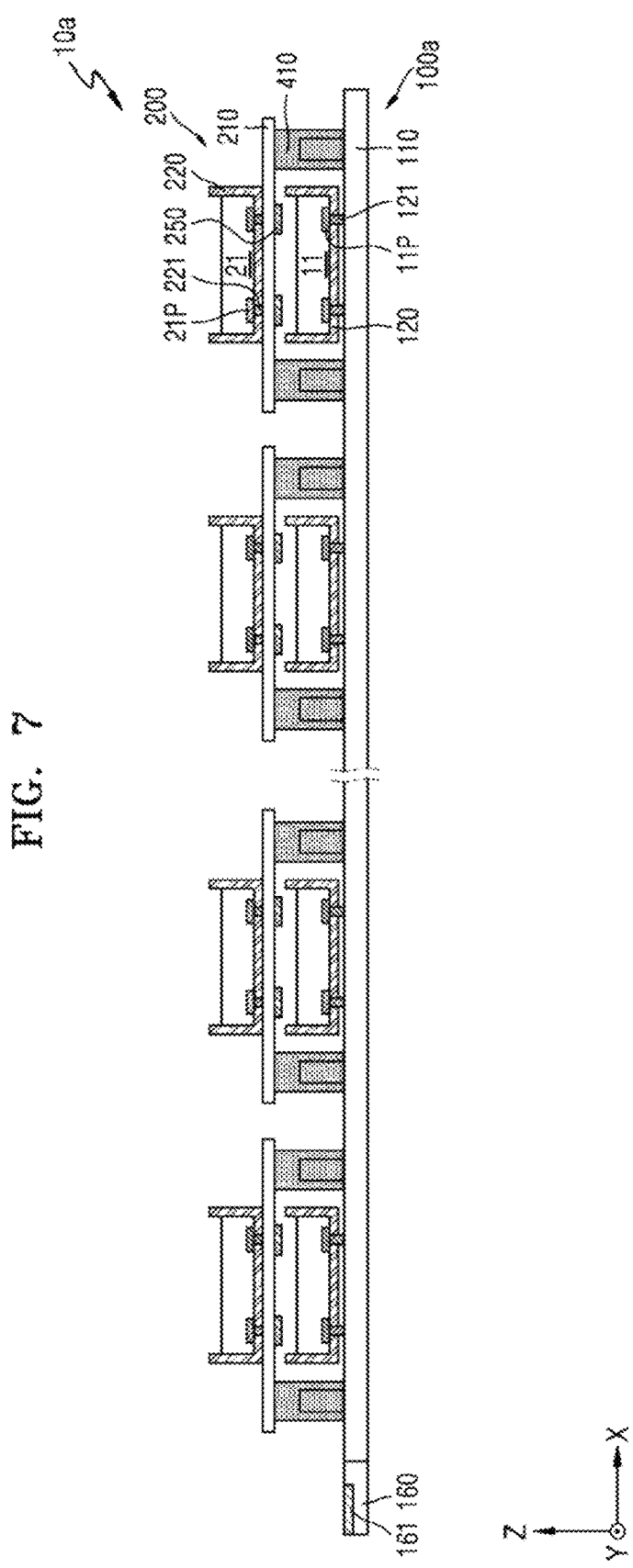
FIG. 7 is a cross-sectional view of the test board of FIG. 6.
Figure 8:
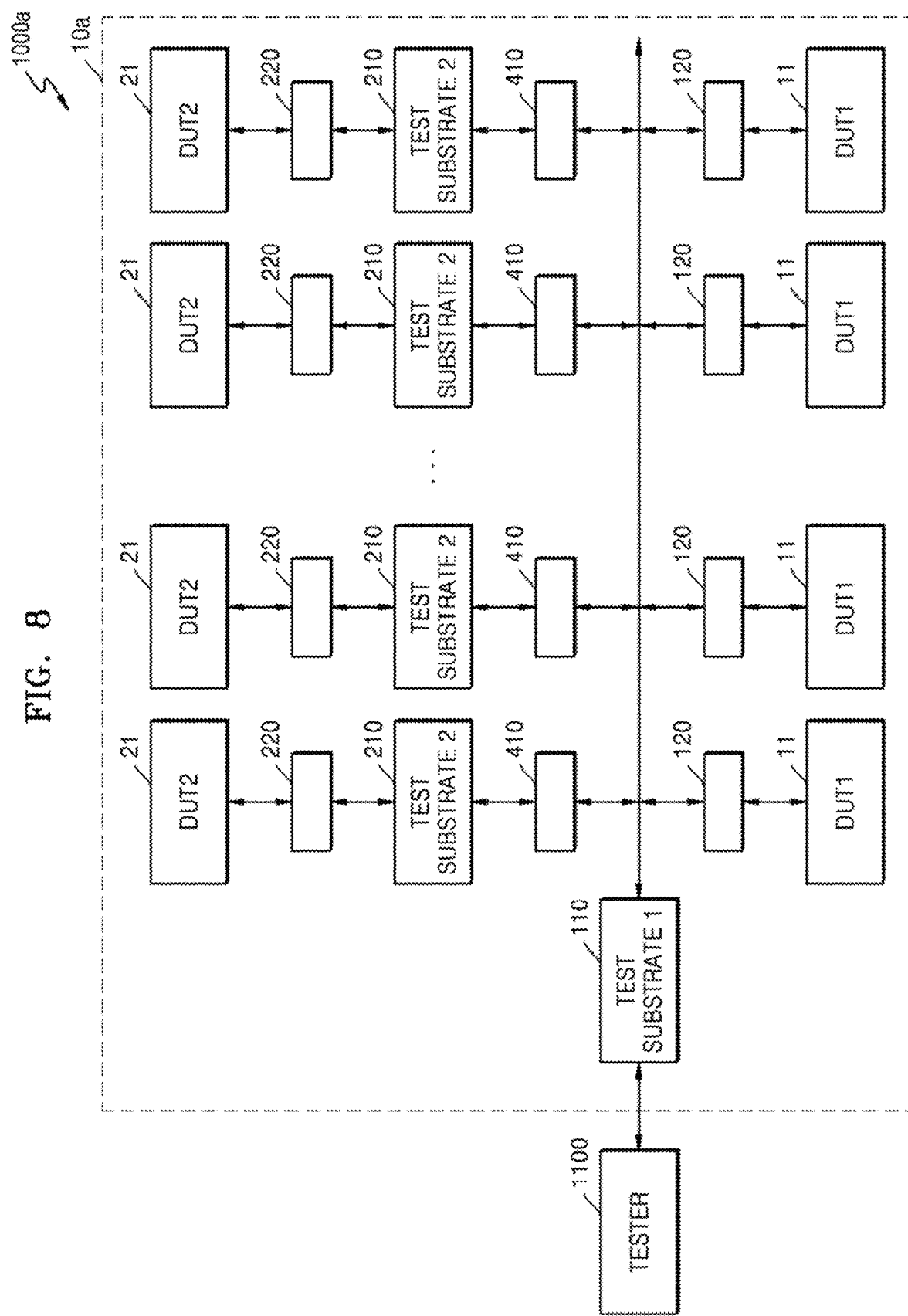
FIG. 8 is a block diagram of a test apparatus including the test board of FIG. 6.

FIG. 6 is a plan view of a test board 10a according to example embodiments. FIG. 7 is a cross-sectional view of the test board 10a of FIG. 6. FIG. 8 is a block diagram of a test apparatus 1000a including the test board 10a of FIG. 6. Hereinafter, the test board 10a of FIGS. 6 to 8 is described based on a difference with the test board 10 described with reference to FIGS. 1A to 5B.

Referring to FIGS. 6 to 8, the test board 10a may include a first board 100a, second boards 200 stacked on the first board 100a, and first inter-board connectors 410.

The first board 100a may include a first test substrate 110 and first sockets 120 mounted on the first test substrate 110. The first test substrate 110 may be understood to be connected to the first sockets 120. The first sockets 120 may be mounted on the first test substrate 110 in a two-dimensional array form. That is, the first sockets 120 may be arranged on the first test substrate 110 in two or more columns and two or more rows. Each of the first sockets 120 may include and/or may be configured to accommodate one first DUT 11. The arrangement of the first DUTs 11 mounted on the first board 100a may be identical to that of the first sockets 120. That is, the first DUTs 11 may be arranged on a surface of the first test substrate 110 in the two-dimensional array form. Accordingly, the first board 100a may be understood to be configured to couple with and/or support (e.g., structurally support, support a structural load and/or weight of, accommodate, mount, etc.) a plurality of first DUTs 11 such that the plurality of first DUTs 11 are mounted on the first board 100a.

The first sockets 120 may be understood to be configured to accommodate the plurality of first DUTs 11 that may be mounted on the first board 100a, where each separate first socket 120 may be configured to accommodate a separate first DUT 11 of the plurality of first DUTs 11. The first board 100a may include an external connector arranged on an edge of the first board 100a and configured to electrically connect a tester of a test apparatus (e.g., tester 1100 shown in FIG. 12) to the first test substrate 110.

The second boards 200 may be stacked on the first board 100a. The second boards 200 may be respectively stacked on the first board 100a through the first inter-board connectors 410. The second boards 200 may be separated from each other in a horizontal direction (an X direction and/or a Y direction) parallel to the upper surface of the first test substrate 110. As shown, a plurality of first inter-board connectors 410 may be on the first board 100a, and the second boards 200a may be stacked on the first board 100a (e.g., in the Z direction) through the plurality of first inter-board connectors 410. For example, each of the second boards 200a may be stacked on the first board 100a through separate, respective (e.g., different) sets of first inter-board connectors 410 of the plurality of first inter-board connectors 410. Referring to FIGS. 2 and 6-8, the first board 100a may include a first interconnect pattern 111 configured to electrically connect one first DUT 11 of the plurality of first DUTs 11 to one first inter-board connector 410 of the plurality of first inter-board connectors 410. The first sockets 120 may be configured to accommodate separate, respective first DUTs 11 of the first DUTs and electrically connect the first DUTs 11 to the first interconnect pattern 111. Referring to FIGS. 1A-2 and 6-8, each first inter-board connector 410 of the plurality of first inter-board connectors 410 may include a first lower connector (e.g., lower connector 410L) coupled to the first board 100a and a first upper connector (e.g., upper connector 410U) coupled to one second board 200 of the plurality of second boards 200 and separably coupled to the first lower connector (e.g., lower connector 410L). As shown, the first board 100a may include a first test substrate 110 including an upper surface and a lower surface that is opposite to the upper surface, wherein the first board 100a is configured to support the plurality of first DUTs 11 such that the plurality of first DUTs 11 are mounted on the upper surface of the first test substrate 110, and the plurality of second boards 200 may be stacked on the upper surface of the first test substrate 110 through the plurality of first inter-board connectors 410.

The second boards 200 may be respectively stacked on the first board 100a to cover any one of the first DUTs 11. The second boards 200 may be understood to each be configured to couple with and/or support (e.g., structurally support, support a structural load and/or weight of, accommodate, mount, etc.) a separate second DUT 21 of a plurality of second DUTs 21 such that the plurality of second DUTs 21 are mounted on separate, respective second boards 200 of the second boards 200. The second boards 200 may each include a separate second socket 220 that is configured to accommodate a separate second DUT 21 of the plurality of second DUTs 21 and a second test substrate 210 connected to the second socket 220. In a vertical direction (a Z direction) perpendicular to the upper surface of the first test substrate 110, a location of the second socket 220 included in each second board 200 may overlap a location of any one of the first sockets 120 in the vertical direction (a Z direction), and a location of the second DUT 21 mounted on the second socket 220 may overlap a location of any one of the first DUTs 11 in the vertical direction (a Z direction). In example embodiments, each second board 200 of the plurality of second boards 200 may further include one or more decoupling capacitors 250 mounted on (e.g., below) the second test substrate 210. Referring to FIGS. 2 and 6-8, one second board 200 of the second boards 200 may include a second interconnect pattern 211 configured to electrically connect one second DUT mounted on the one second board 200 to one first inter-board connector 410 of the first inter-board connectors 410. The second board 200 may include a second socket 220 configured to accommodate a second DUT 21 and electrically connect the second DUT 21 to the second interconnect pattern 211. In example embodiments, at least one first DUT 11 mounted on the first board 100a may be electrically connected to a second DUT 21 accommodated in the second socket 220, through the first interconnect pattern 111 of the first test substrate 110, the first inter-board connector 410, and the second interconnect pattern 211 of the second test substrate 210. The test board 10a may be configured to enable the at least one first DUT 11 and the second DUT 21 to simultaneously receive a test signal (e.g., from the tester 1100 shown in FIG. 12 through the external connector 160 which may be connected to the first test substrate 110) corresponding to any one of an address signal, a data signal, or a command signal, through the first interconnect pattern 111 of the first test substrate 110, the first inter-board connector 410, and the second interconnect pattern 211 of the second test substrate 210.

In example embodiments, the number (e.g., quantity) of second boards 200 and the number (e.g., quantity) of second DUTs 21 mounted on the second boards 200 may be identical to the number (e.g., quantity) of first DUTs 11 mounted on the first board 100a. In other words, the number of second boards 200 and the number of second DUTs 21 mounted on the second boards 200 may be identical to the number of first sockets 120 included in the first board 100a.

In example embodiments, on the plan view, the test board 10a may be partitioned into test blocks. For example, the test board 10a may be partitioned into two, four, or eight test blocks. Each test block may include at least one first DUT 11 and at least one second DUT 21. In this case, DUTs included in the same test block may be configured to simultaneously receive a test signal of the same type, for example, any one of the address signal, the data signal, or the command signal. DUTs included in different test blocks may be configured to receive test signals through different signal transmission paths.

For example, each test block may include one first DUT 11 and one second DUT 21 that are adjacent to each other in the vertical direction (the Z direction). In this case, the first DUT 11 and the second DUT 21 included in the same test block may be electrically connected to each other through a signal transmission path and may be connected in parallel through the signal transmission path.

For example, each test block may include two or more first DUTs 11 and second DUTs 21 of the second boards 200 that overlap, in the vertical direction (the Z direction), some regions of the first test substrate 110 on which the two or more first DUTs 11 are mounted. In this case, the two or more first DUTs 11 and two or more second DUTs 21 included in the same test block may be electrically connected through a signal transmission path and may be connected in parallel through the signal transmission path.

Figure 12:
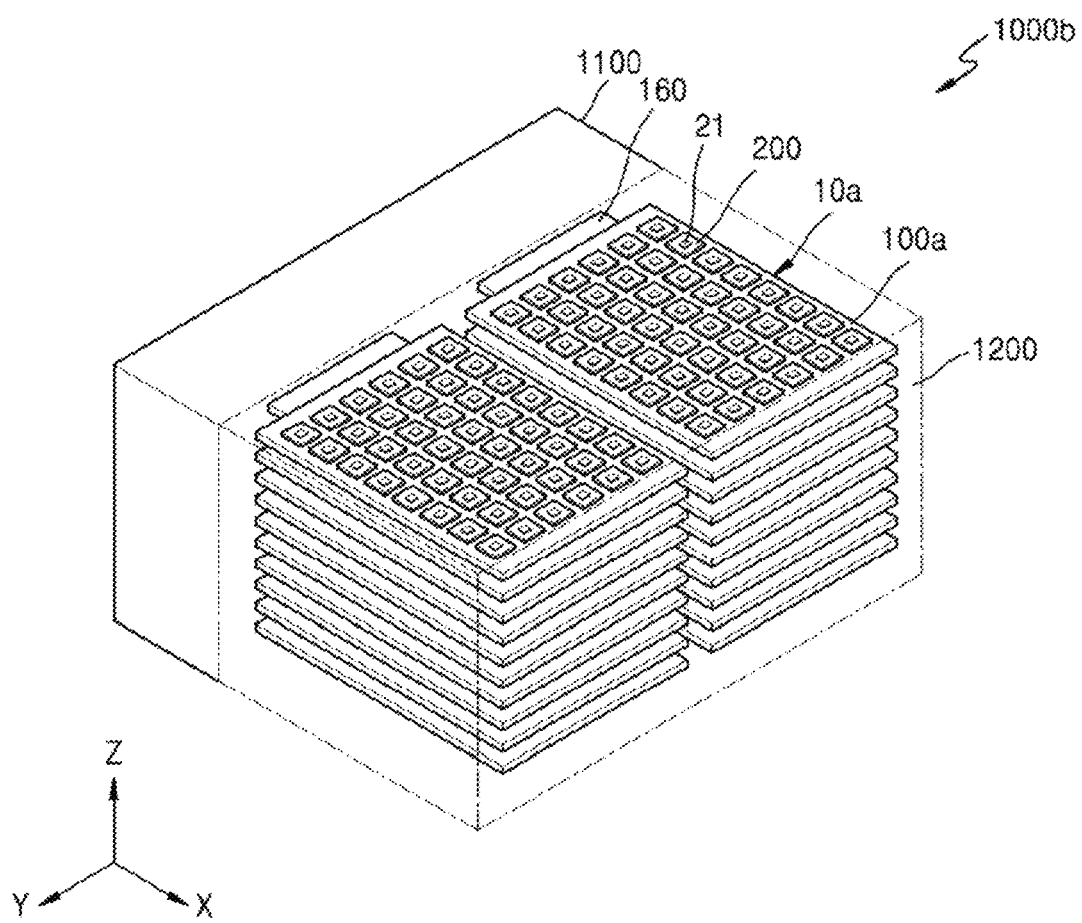
FIG. 12 is a cross-sectional view of a test apparatus according to example embodiments.

In a general test, a test is conducted by mounting a board on an interface socket of a test chamber (1200 of FIG. 12). In this case, the maximum number of DUTs tested during one test may be determined by the maximum number of DUTs mounted on the board, the maximum number of DUTs mounted on the board may be determined by a size of the board.

In example embodiments, because the test board 10a has a structure in which the second boards 200, on which the second DUTs 21 are mounted, are stacked on the first board 100a on which the first DUTs 11 are mounted, the first DUTs 11 and the second DUTs 21 may be simultaneously tested in one test. Because the DUTs that are three-dimensionally arranged on the test board 10a may be simultaneously tested, the productivity of a test process and the productivity of a semiconductor apparatus manufacturing process including the test process may be improved.

Figure 9:
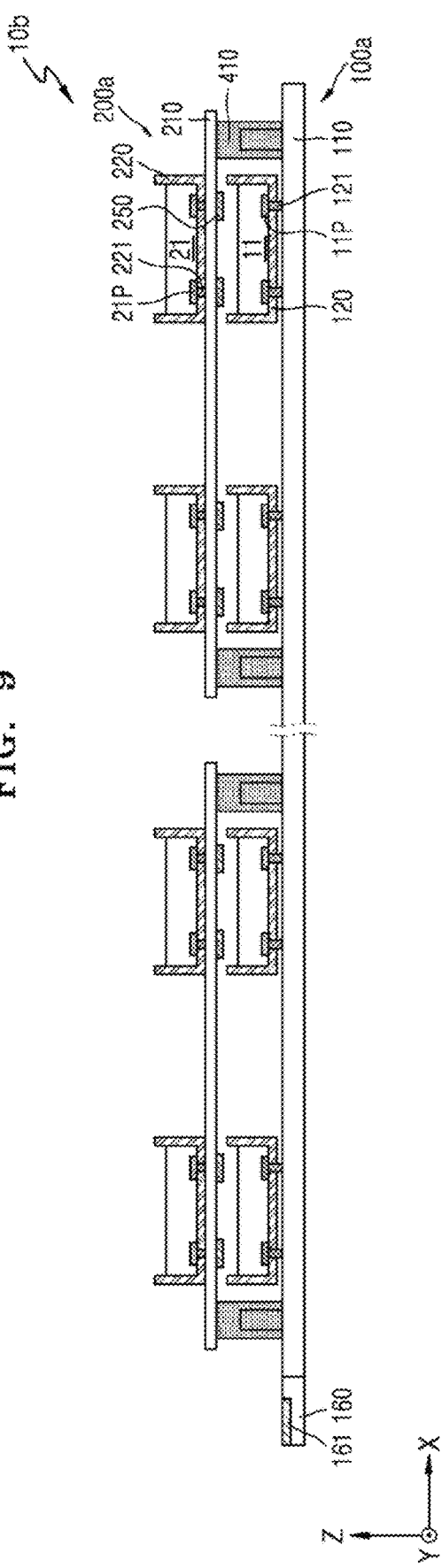
FIG. 9 is a cross-sectional view of a test board according to example embodiments.

FIG. 9 is a cross-sectional view of a test board 10b according to example embodiments. Hereinafter, the test board 10b of FIG. 9 is described based on a difference with the test board 10a described with reference to FIGS. 6 to 8.

Referring to FIG. 9, the test board 10b may include the first board 100a, the second boards 200a stacked on the first board 100a, and the first inter-board connector 410. The second boards 200a may respectively include mounting regions where two or more second DUTs 21 are mounted. Accordingly, as shown in FIG. 9, each second board 200a may include a plurality of mounting regions (e.g., second sockets 220) configured to support (e.g., accommodate, structurally support, mount, etc.) two or more separate, respective second DUTs 21 of the plurality of second DUTs 21. The second board 200a may include a second test substrate 210 including a second interconnect pattern 211, and second board 200a may further include a plurality of second sockets 220 that may be connected to the second test substrate 210 and each separately configured to accommodate a separate second DUT 21.

The second boards 200a may each include the second test substrate 210, the second sockets 220 mounted on the second test substrate 210, and the decoupling capacitor 250.

Two second sockets 220 may be mounted on the second test substrate 210, or three or more second sockets 220 may be mounted thereon. In example embodiments, the second sockets 220 may be arranged on the second test substrate 210 in two or more rows and columns.

Because one second DUT 21 is mounted on each second socket 220, the number of second DUTs 21 mountable on one second board 200a may be identical to that of second sockets 220 included in one second board 200a, and the arrangements of the second DUTs 21 mounted on the second board 200a may correspond to the arrangements of the second sockets 220.

In example embodiments, the number of second DUTs 21 mounted on one second board 200a may be identical to that of first DUTs 11 in some regions of the first board 100a overlapping (or covered by) the second board 200a. For example, a quantity of first sockets 120 in some regions of the first board 100a that are overlapped by one or more second board 200a in a direction perpendicular to an upper surface of the first test substrate 110 (e.g., the Z direction) may be identical to a quantity of second sockets 220 in the one or more second boards 200a. In other words, the number of second sockets 220 mounted on the second board 200a may be identical to the number of first sockets 120 in some regions of the first board 100a overlapping (or covered by) the second board 200a.

In example embodiments, the test board 10b may be partitioned into test blocks on the plan view, and each test block may include at least one second board 200a and a portion of the first board 100a covered by the at least one second board 200a. For example, when each test block includes one second board 200a, the test board 10b may include test blocks partitioned according to the number of second boards 200a.

For example, when each test block includes one second board 200a, each test block may include the second DUTs 21 mounted on one second board 200a, and the first DUTs 11 in some regions of the first board 100a covered by the second board 200a. In this case, the first DUTs 11 and the second DUTs 21 in each test block may be connected in parallel through the signal transmission path.

Figure 10:
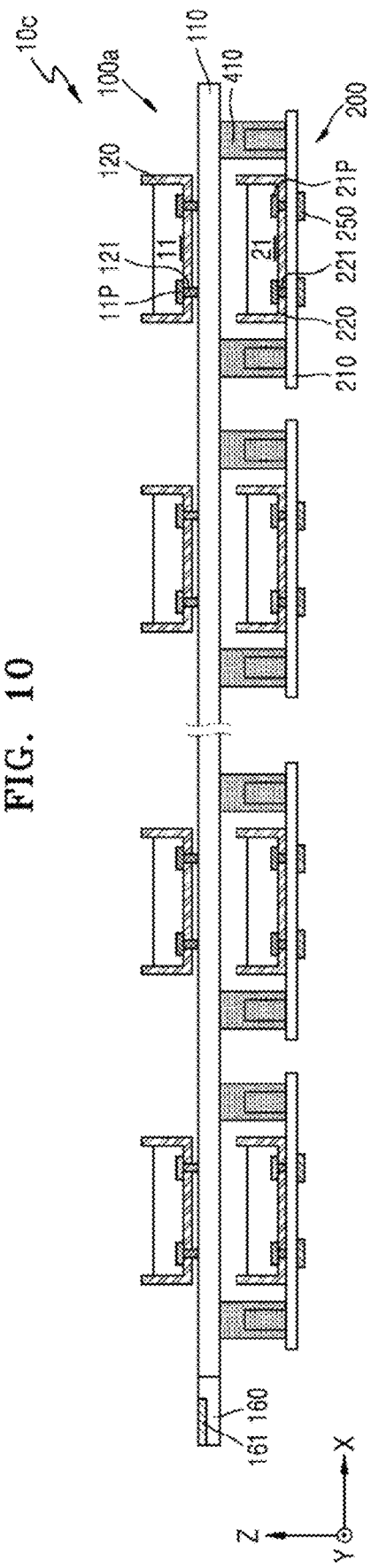
FIG. 10 is a cross-sectional view of a test board according to example embodiments.

FIG. 10 is a cross-sectional view of a test board 10c according to example embodiments. Hereinafter, the test board 10c of FIG. 10 is described based on a difference with the test board 10a described with reference to FIGS. 6 to 8.

Referring to FIG. 10, the test board 10c may include the first board 100a, second boards 200 stacked under the first board 100a, and the first inter-board connectors 410. The second boards 200 may each include the second test substrate 210, the second socket 220 mounted on the second test substrate 210, and the decoupling capacitor 250.

When the first test substrate 110 includes an upper surface and a lower surface that are opposite to each other, the first socket 120, on which the first DUT 11 is mounted, is on the upper surface of the first test substrate 110, and the second test substrates 210 may be stacked on the lower surface of the first test substrate 110 through the first inter-board connectors 410. The second test substrates 210 may be separated from each other on the lower surface of the first test substrate 110 in the horizontal direction (the X direction and/or the Y direction). As shown, the first board 100a may include a first test substrate 110 that includes an upper surface and a lower surface that is opposite to the upper surface, where the first board 100a is configured to support the plurality of first DUTs 11 such that the plurality of first DUTs 11 are mounted on (e.g., above) the upper surface of the first test substrate 110, and the plurality of second boards 200 are stacked on (e.g., beneath) the lower surface of the first test substrate 110 through the plurality of first inter-board connectors 410.

The second boards 200 may overlap the first sockets 120 in the vertical direction (the Z direction). Locations of the second sockets 220 included in the second boards 200 may overlap locations of the first sockets 120 in the vertical direction (the Z direction). In this case, the arrangements of the second boards 200 may be the same or substantially the same as the arrangements of the first sockets 120. For example, the second boards 200 may be arranged on the lower surface of the first test substrate 110 in a two-dimensional array form.

As illustrated in FIG. 10, the second boards 200 may each include the second test substrate 210 and one second socket 220 mounted on the second test substrate 210. In this case, one second DUT 21 may be mounted on each of the second boards 200.

Alternatively, in other example embodiments, the second boards 200 may each include the second test substrate 210 and two or more second sockets 220 mounted on the second test substrate 210. In this case, two or more second DUTs 21 may be mounted on each of the second boards 200.

Figure 11:
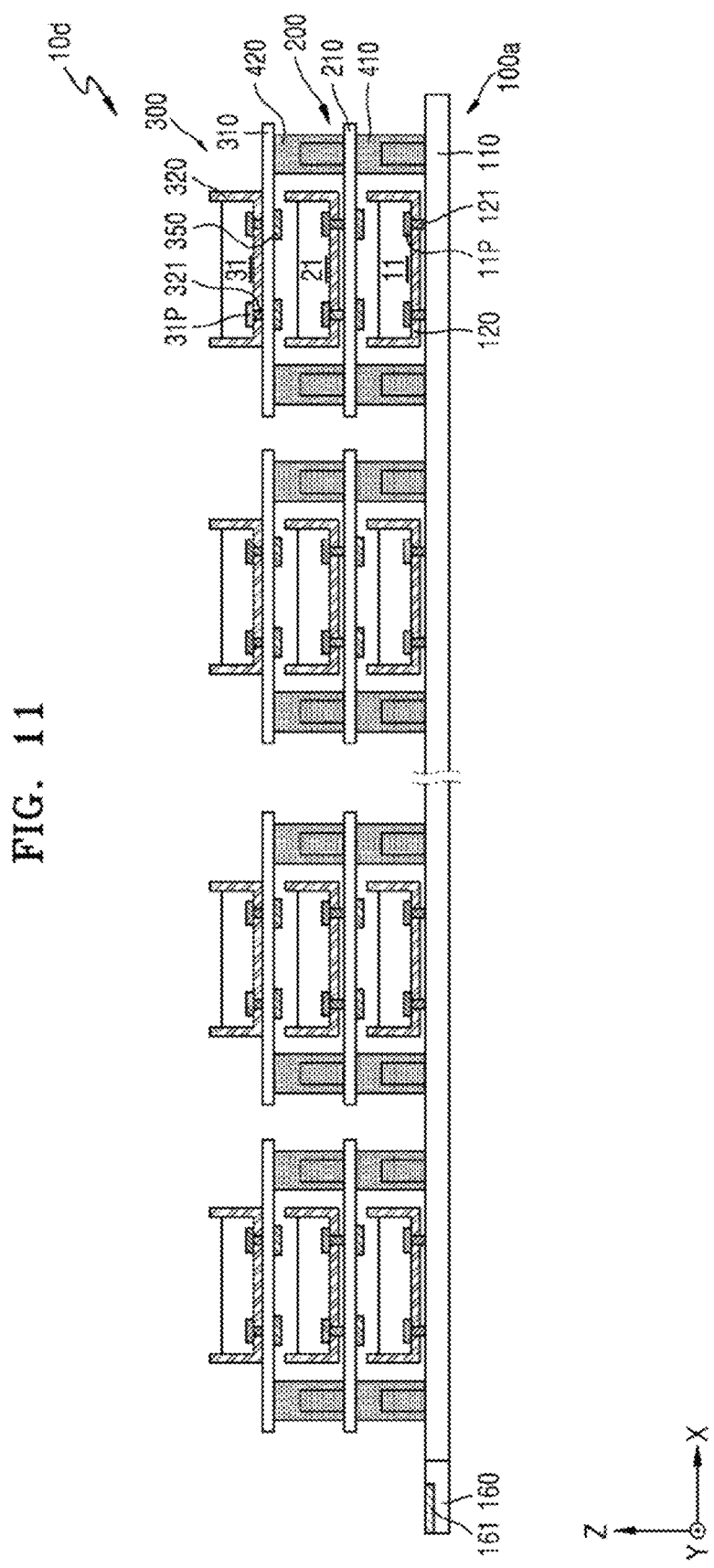
FIG. 11 is a cross-sectional view of a test board according to example embodiments.

FIG. 11 is a cross-sectional view of a test board 10d according to example embodiments.

The test board 10d of FIG. 11 may be the same or substantially the same as or similar to the test board 10a described with reference to FIGS. 6 to 8, except that the test board 10d further includes third boards 300. Hereinafter, the test board 10d of FIG. 11 is described based on a difference with the test board 10a described with reference to FIGS. 6 to 8.

Referring to FIG. 11, the test board 10d may include a plurality of second inter-board connectors 420 on the plurality of second boards 200, and a plurality of third boards 300 stacked on the plurality of second boards 200 through the plurality of second inter-board connectors 420 where one or more second inter-board connectors 420 may be configured to electrically connect a second board 200 to a third board 300. Each third board 300 of the plurality of third boards 300 may be configured to support e.g., structurally support, support a structural load and/or weight of, accommodate, mount, etc.) a separate third DUT 31 such that the third DUT 31 is mounted on the third board 300. Each third board 300 of the plurality of third boards 300 may include a third test substrate 310, a third socket 320 connected to the third test substrate and configured to accommodate a separate third DUT 31 of a plurality of third DUTs 31, and a decoupling capacitor 350 mounted on (e.g., beneath) the third test substrate 310.

Referring to FIG. 11, the test board 10d may include the first board 100a, the second boards 200 stacked on the first board 100a, the first inter-board connectors 410, the third boards 300 stacked on the second boards 200, and second inter-board connectors 420. The third boards 300 may be stacked on the second boards 200 through the second inter-board connectors 420. At least one third DUT 31 may be mounted on each of the third boards 300.

The third boards 300 may each include a third test substrate 310, a third socket 320 mounted on the third DUT 31, and a decoupling capacitor 350 mounted on the third test substrate 310.

The third test substrate 310 may be planar or substantially planar. At least one third DUT 31 may be arranged on the third test substrate 310. The third test substrate 310 may be electrically connected to the second test substrate 210 through the second inter-board connector 420. The third test substrate 310 may be stacked on the second test substrate 210 to cover the second socket 220 arranged on the second test substrate 210.

The third test substrate 310 may include a PCB. In more detail, the third test substrate 310 may include a substrate base including an insulating material and a third interconnect pattern including a conductive material and included in the substrate base.

The third socket 320 may be on the third test substrate 310. The third socket 320 may accommodate and support the third DUT 31. The third DUT 31 may be separably mounted on the third socket 320. The third socket 320 may electrically connect the third DUT 31 to the third test substrate 310. The third socket 320 may include a third socket pin 321 configured to electrically connect a third connection pin 31P of the third DUT 31 to a interconnect pattern of the third test substrate 310. The third socket 320 may have a structure appropriate to mount thereon a semiconductor apparatus corresponding to the third DUT 31. The semiconductor apparatus corresponding to the third DUT 31 may have a structure the same or substantially the same as or similar to that of the semiconductor apparatus corresponding to the first DUT 11, and the structure of the third socket 320 may be the same or substantially the same as or similar to that of the first socket 120.

Similar to the first inter-board connector 410, the second inter-board connector 420 may each include a lower connector and an upper connector that are separably coupled to each other. The lower connector of the second inter-board connector 420 may be coupled to the second test substrate 210, and the upper connector of the second inter-board connector 420 may be coupled to the third test substrate 310. When the lower connector and the upper connector of the second inter-board connector 420 are separated from each other, the third board 300 may be separated from the second board 200. When the lower connector and the upper connector of the second inter-board connector 420 are coupled to each other, the third board 300 may be coupled to the second board 200.

To test the first DUT 11, the second DUT 21, and the third DUT 31 mounted on the test board 10d, test signals from the external tester 1100 may be provided to the first DUT 11, the second DUT 21, and the third DUT 31 through the test board 10d in the same or substantially the same period of time.

In example embodiments, the first connection pin 11P of the first DUT 11, the second connection pin 21P of the second DUT 21, and the third connection pin 31P of the third DUT 31 are pins having the same features and may be configured to receive test signals of the same type through the test board 10d while the test is conducted. For example, the first connection pin 11P of the first DUT 11, the second connection pin 21P of the second DUT 21, and the third connection pin 31P of the third DUT 31 may be pins having the same features and configured to receive a signal corresponding to any one of an address signal, a data signal, and a command signal. For example, the first connection pin 11P of the first DUT 11, the second connection pin 21P of the second DUT 21, and the third connection pin 31P of the third DUT 31 may be pins having the same features and configured to receive a signal corresponding to any one of a power signal and a ground signal.

The first connection pin 11P of the first DUT 11, the second connection pin 21P of the second DUT 21, and the third connection pin 31P of the third DUT 31 may be electrically connected through the signal transmission path included in the test board 10d. For example, the first connection pin 11P of the first DUT 11 and the second connection pin 21P of the second DUT 21 may be electrically connected to each other through a signal transmission path via the first socket pin 121 of the first socket 120, the first interconnect pattern (111 of FIG. 2) of the first test substrate 110, the first inter-board connector 410, the second interconnect pattern (211 of FIG. 2) of the second test substrate 210, and the second socket pin 221 of the second socket 220. For example, the first connection pin 11P of the first DUT 11 and the third connection pin 31P of the third DUT 31 may be electrically connected to each other through a signal transmission path via the first socket pin 121 of the first socket 120, the first interconnect pattern 111 of the first test substrate 110, the first inter-board connector 410, the second interconnect pattern 211 of the second test substrate 210, the second inter-board connector 420, the interconnect pattern of the third test substrate 310, and the third socket pin 321 of the third socket 320. For example, the second connection pin 21P of the second DUT 21 and the third connection pin 31P of the third DUT 31 may be electrically connected to each other through a signal transmission path via the second socket pin 221 of the second socket 220, the second interconnect pattern 211 of the second test substrate 210, the second inter-board connector 420, the interconnect pattern of the third test substrate 310, and the third socket pin 321 of the third socket 320.

FIG. 11 illustrates that the test board 10d has a tri-layer structure in which the second board 200 and the third board 300 are sequentially stacked on the first board 100a. In other example embodiments, the test board 10d may have a stack structure in which one or at least two boards, on which the DUT is mounted, are further stacked on each third board 300 and thus have at least four layers in total.

FIG. 12 is a cross-sectional view of a test apparatus 1000b according to example embodiments.

Referring to FIG. 12, the test apparatus 1000b may include the tester 1100, the test chamber 1200, and the test board 10a mounted in the test chamber 1200.

The tester 1100 may store a test program, execute test commands, and determine a test result. The tester 1100 may generate a test signal and may transmit the test signal to the test board 10a.

The tester 1100 may include automatic test equipment (ATE). The ATE may include a processor for controlling hardware components installed inside and internal hardware components. Here, the internal hardware components may include a programmable power supply, a DC parameter measurement unit, an algorithmic pattern generator, a timing generator, a wave sharp formatter, a drive channel, an input/output channel, a power channel, and the like. The ATE may allow hardware components to exchange signals according to a test program executed by the processor and may test the electrical performance on the DUTs mounted on the test board 10a.

The test chamber 1200 may have an internal space where the test boards 10a are mounted and may be connected to the tester 1100. Each test board 10a may be understood to be configured to couple with and/or support (e.g., structurally support, support a structural load and/or weight of, accommodate, mount, etc.) a plurality of semiconductor apparatuses as devices under test (DUTs) such that the DUTs are mounted on the test board 10a. The external connector 160 of each test board 10a (e.g., of the first board 100a of each test board 10a) may be connected to an interface socket of the test chamber 1200 and may electrically connect the tester 1100 to the first test substrate 110 of the test board 10a. In a state in which the test boards 10a are mounted on the test chamber 1200, the test signals from the tester 1100 may be transmitted to the DUTs through the test board 10a, and thus, tests on the DUTs may be performed.

In example embodiments, the test apparatus 1000b may perform a burn-in test. For example, the burn-in test on the DUT may be conducted under a room-temperature condition, a low-temperature condition, or a high-temperature condition, according to a set temperature. Also, the burn-in test on the DUT may be conducted under a dry condition, a humid condition, etc., according to set humidity. That is, according to commands from the tester 1100, the test chamber 1200 may variously adjust a temperature and/or humidity environment.

As described herein, any systems, devices, electronic devices, modules, units, blocks, logic, controllers, circuitry, circuits, and/or portions thereof according to any of the example embodiments, and/or any portions thereof (including, without limitation, test apparatus 1000, test apparatus 1000a, test apparatus 1000b, tester 1100, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any systems, devices, electronic devices, modules, units, blocks, logic, controllers, circuitry, circuits, and/or portions thereof according to any of the example embodiments.

Figure 13:
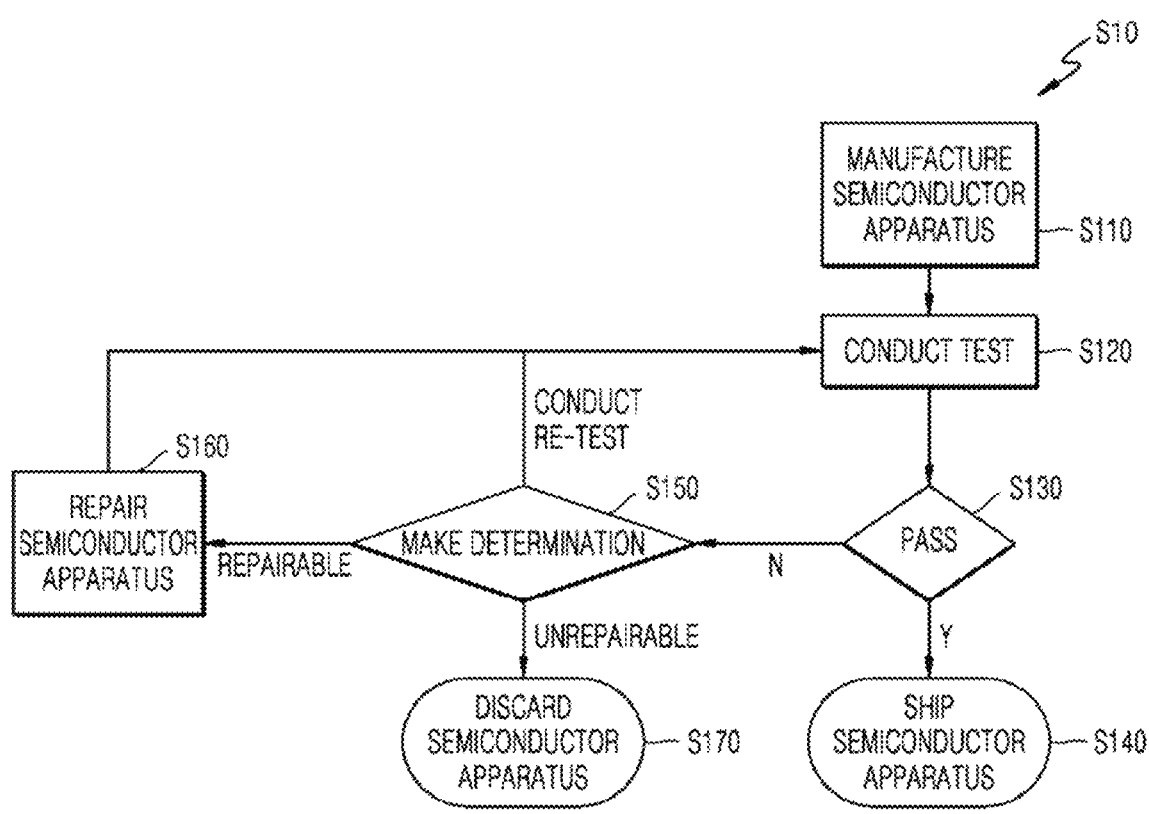
FIG. 13 is a flowchart of a test method of a semiconductor apparatus using a test apparatus and a manufacturing method of the semiconductor apparatus that includes the test method, according to example embodiments.

FIG. 13 is a flowchart of a test method of a semiconductor apparatus using a test apparatus and a manufacturing method of the semiconductor apparatus including the test method, according to example embodiments.

Hereinafter, referring to FIGS. 6 to 8, 12, and 13, a manufacturing method S10 of a semiconductor apparatus including a test method of the semiconductor apparatus is described. Some or all of the operations of the manufacturing method S10 may be implemented in part or in full by any systems, devices, electronic devices, modules, units, blocks, logic, controllers, circuitry, circuits, and/or portions thereof according to any of the example embodiments (including, without limitation, test apparatus 1000, test apparatus 1000a, test apparatus 1000b, tester 1100, or the like).

Referring to FIG. 13, the manufacturing method S10 of a semiconductor apparatus may include first to seventh operations (S110 to S170). When a certain example embodiment may be implemented differently, a specific process order may be performed differently from the described order. For example, two consecutively described processes may be performed at the same time or substantially at the same time or performed in an order opposite to the described order.

The first operation (S110) of manufacturing the semiconductor apparatus is performed. When the process of manufacturing the semiconductor apparatus is examined in detail, a semiconductor device is manufactured by preparing a semiconductor wafer. The semiconductor device may include, for example, a system LSI, flash memory, DRAM, Static Random Access Memory (SRAM), Electrically Erasable and Programmable ROM (EEPROM), PRAM, MRAM, or RRAM.

The first operation (S110) may include forming a device isolation structure that defines a conductive area and an active area of the semiconductor wafer. A semiconductor device including various individual devices is formed on the semiconductor wafer including the active area defined by the device isolation structure. The individual device may include various micro-electronic devices, for example, a metal-oxide-semiconductor field effect transistor (MOSFET) such as a complementary metal-insulator-semiconductor (CMOS) transistor, an image sensor such as a CMOS imaging sensor (CIS), a micro-electro-mechanical system (MEMS), an active element, a passive element, and the like.

The individual device may be electrically connected to the conductive area. The semiconductor device may include at least two of the individual devices, a conductive wire electrically connecting the individual devices to the conductive area, and/or a conductive plug. Each individual device may be electrically separated from other individual devices adjacent to each other by an insulating layer. The semiconductor device may include various circuit components for driving the individual devices. Also, the semiconductor device may include a metal wire that electrically connects the individual device to the circuit component, a metal via, and/or an inter-metal insulating layer.

After the semiconductor devices are formed on the semiconductor wafer, the individual semiconductor devices are separated and packaged, thus forming the semiconductor apparatus. The semiconductor apparatus may include connection pins connected to the first test substrate 110 and/or the second test substrate 210 of the test board 10a.

The semiconductor apparatus may be a semiconductor package including semiconductor devices, that is, semiconductor dies. In some example embodiments, the semiconductor apparatus may include semiconductor dies of the same type. Alternatively, the semiconductor apparatus may include semiconductor dies of different types.

In some example embodiments, the semiconductor apparatus may include a semiconductor package. For example, the semiconductor apparatus may be a semiconductor package such as a Package on Package (PoP), a Chip scale package (CSP), a Die in Waffle Pack, a Die in Wafer Form, a Chip On Board (COB), a System In Package (SIP), a Multi Chip Package (MCP), a Wafer-level Fabricated Package (WFP), or a Wafer-Level Processed Stack Package (WSP).

The second operation (S120) of conducting a test is performed on semiconductor apparatuses. The test on the semiconductor apparatuses may include, for example, a burn-in test, a DC test, an AC test, or a function test.

The semiconductor apparatuses are mounted on the test board 10a to conduct the test on the semiconductor apparatuses. In detail, some of the semiconductor apparatuses may be mounted on the first board 100a, and others thereof may be mounted on the second board 200. In second operation (S120), the test signal from the tester 1100 may be provided to the test board 10a through the external connector 160 and may be provided to the first DUTs 11 mounted on the first board 100a and the second DUTs 21 mounted on the second board 200 through the signal transmission path included in the test board 10a. The tests on the first DUTs 11 and the second DUTs 21 may be simultaneously conducted, and results of the tests on the first DUTs 11 and the second DUTs 21 may be transmitted to the tester 1100.

The third operation (S130) of checking whether the results are a pass or a fail is performed. In the fourth operation (S140), the semiconductor apparatus having passed the test (S130, Y) may be shipped and supplied to the market. That is, the semiconductor apparatus, having passed the test (S130, Y) may be separated from the test board 10a and supplied to the market. On the contrary, the semiconductor apparatus, which fails the test (S130, N), proceeds to the fifth operation (S150). A determination as to whether the semiconductor apparatus having failed the test (S130, N) is repaired or re-tested is made.

Such a determination may be made by analyzing the results of the tests. For example, when the test board 10a is suspected to be defective or when the test results are unclear, a re-test may be conducted. When the re-test is conducted, components in the test board 10a may be replaced according to necessity.

Alternatively, when it is determined that the semiconductor apparatus is repairable, the sixth operation (S160) of repairing the semiconductor apparatus may be performed, and the re-test may be performed. On the contrary, the semiconductor apparatus, which is determined to be unrepairable or fails the test even in the re-test, is discarded in the seventh operation (S170).

According to some example embodiments, because tests on DUTs, which are three-dimensionally arranged on the test board 10a, may be simultaneously conducted, the productivity of a test process and the productivity of a semiconductor apparatus manufacturing process including the test process may be improved.

While the inventive concepts has been particularly shown and described with reference to embodiments thereof, it will be understood that various changes in form and details may be made therein without departing from the spirit and scope of the following claims.

What is claimed is:

1. A test board for testing a semiconductor apparatus, the test board comprising:
   a first board configured to support a plurality of first Devices Under Test (DUTs) such that the plurality of first DUTs are mounted on the first board;
   a plurality of first inter-board connectors on the first board; and
   a plurality of second boards stacked on the first board through the plurality of first inter-board connectors, each second board of the plurality of second boards having a surface configured to support a separate second OUT of a plurality of second DUTs such that the plurality of second DUTs are mounted on separate, respective second boards of the plurality of second boards,
   wherein each first inter-board connector of the plurality od first inter-board connectors includes
      a first lower connector coupled to the first board; and
      a first upper connector coupled to one second board of the plurality of second boards,
   wherein one of the first lower connector or the first upper connector includes a groove, and the other one of the first lower connector or the first upper connector includes a portion that is configured to be inserted into the groove such that the first lower connector and the first upper connector are coupled to each other, and
   wherein the first lower connector and the first upper connector are configured to be separably coupled to each other based on the portion being inserted into the groove such that the one second board of the plurality of second boards is separably coupled to the first board.

2. The test board of claim 1, wherein a quantity of second boards is identical to a quantity of first DUTs mounted on the first board.

3. The test board of claim 1, wherein
   the first board includes a plurality of first sockets configured to accommodate the plurality of first DUTs and a first test substrate connected to the plurality of first sockets, and
   the plurality of second boards each include
      a second socket configured to accommodate one second DUT of the plurality of second DUTs, and
      a second test substrate connected to the second socket.

4. The test board of claim 3, wherein each second board of the plurality of second boards further includes a decoupling capacitor mounted on the second test substrate.

5. The test board of claim 1, wherein
   the first board comprises a first interconnect pattern configured to electrically connect one first DUT of the plurality of first DUTs to one first inter-board connector of the plurality of first inter-board connectors, and
   one second board of the plurality of second boards includes a second interconnect pattern configured to electrically connect one second DUT of the plurality of second DUTs that is mounted on the one second board to the one first inter-board connector of the plurality of first inter-board connectors.

6. The test board of claim 1, wherein each second board of the plurality of second boards includes a plurality of mounting regions configured to support the plurality of second DUTs.

7. The test board of claim 1, wherein
   the first board includes a first test substrate including an upper surface and a lower surface that is opposite to the upper surface, wherein the first board is configured to support the plurality of first DUTs such that the plurality of first DUTs are mounted on the upper surface of the first test substrate, and
   the plurality of second boards are stacked on the lower surface of the first test substrate through the plurality of first inter-board connectors.

8. The test board of claim 1, wherein
   the first board includes a first test substrate including an upper surface and a lower surface that is opposite to the upper surface, wherein the first board is configured to support the plurality of first DUTs such that the plurality of first DUTs are mounted on the upper surface of the first test substrate, and
   the plurality of second boards are stacked on the upper surface of the first test substrate through the plurality of first inter-board connectors.

9. The test board of claim 8, further comprising:
   a plurality of second inter-board connectors on the plurality of second boards; and
   a plurality of third boards stacked on the plurality of second boards through the plurality of second inter-board connectors,
   wherein each third board of the plurality of third boards includes
      a third test substrate,
      a third socket connected to the third test substrate and configured to accommodate a third DUT, and
      a decoupling capacitor mounted on the third test substrate.

10. The test board of claim 1, wherein each first inter-board connector of the plurality of first inter-board connectors is bent on a plan view.

11. A test apparatus, comprising:
a test chamber;
a test board mounted on the test chamber, the test board configured to support a plurality of semiconductor apparatuses as a plurality of Devices Under Test (DUTs) such that the plurality of DUTs are mounted on the test board; and
a tester configured to transmit a test signal to the test board,
wherein the test board includes
a first board configured to support a plurality of first DUTs such that the plurality of first DUTs are mounted on the first board,
a second board stacked on the first board and configured to support a second DUT such that the second DUT is mounted on the second board, and
a first inter-board connector configured to electrically connect the first board to the second board,
wherein each first inter-board includes
a first lower connector coupled to the first board; and
a first upper connector coupled to the second board,
wherein one of the first lower connector or the first upper connector includes a groove, and the other one of the first lower connector or the first upper connector includes a portion that is configured to be inserted into the groove such that the first lower connector and the first upper connector are coupled to each other, and
wherein the first lower connector and the first upper connector are configured to be separably coupled to each other based on the portion being inserted into the groove such that the one second board is separably coupled to the first board.

12. The test apparatus of claim 11, wherein
the first board includes
a first test substrate including a first interconnect pattern,
a plurality of first sockets configured to accommodate the plurality of first DUTs and electrically connect the plurality of first DUTs to the first interconnect pattern, and
an external connector arranged on an edge of the first board and configured to electrically connect the tester to the first test substrate, and
the second board includes
a second test substrate including a second interconnect pattern; and
a second socket configured to accommodate the second DUT and electrically connect the second DUT to the second interconnect pattern.

13. The test apparatus of claim 12, wherein at least one first DUT of the plurality of first DUTs is electrically connected to the second DUT accommodated in the second socket, through the first interconnect pattern of the first test substrate, the first inter-board connector, and the second interconnect pattern of the second test substrate.

14. The test apparatus of claim 13, wherein the test board is configured to enable the at least one first DUT of the plurality of first DUTs and the second DUT to simultaneously receive the test signal, the test signal corresponding to any one of an address signal, a data signal, or a command signal, through the first interconnect pattern of the first test substrate, the first inter-board connector, and the second interconnect pattern of the second test substrate.

15. The test apparatus of claim 11, wherein
the first board includes
a first test substrate including a first interconnect pattern, and
a plurality of first sockets configured to accommodate separate, respective first DUTs of the plurality of first DUTs and electrically connect the plurality of first DUTs to the first interconnect pattern of the first test substrate, and
the second board includes
a second test substrate including a second interconnect pattern, and
a plurality of second sockets connected to the second test substrate and each separately configured to accommodate the second DUT.

16. The test apparatus of claim 15, wherein a quantity of first sockets in some regions of the first board overlapped by the second board in a direction perpendicular to an upper surface of the first test substrate is identical to a quantity of second sockets in the second board.

17. The test apparatus of claim 11, wherein the test board further comprises:
a third board stacked on the second board and configured to support third DUT such that the third DUT is mounted on the third board; and
a second inter-board connector configured to electrically connect the second board to the third board.

18. The test apparatus of claim 17, wherein the third board includes
a third socket configured to accommodate the third DUT,
a third test substrate connected to the third socket, and
a decoupling capacitor mounted on the third test substrate.

19. A test apparatus, comprising:
a test chamber;
a test board mounted on the test chamber, the test board configured to support a plurality of semiconductor apparatuses as a plurality of Devices Under Test (DUTs) such that the plurality of DUTs are mounted on the test board; and
a tester configured to transmit a test signal to the test board,
wherein the test board includes
a first board including a first test substrate, a plurality of first sockets connected to the first test substrate and each configured to accommodate a separate first DUT of a plurality of first DUTs, and an external connector connected to the first test substrate;
a plurality of second boards stacked on the first board, each second board of the plurality of second boards including a second test substrate, a second socket connected to the second test substrate and configured to accommodate a second DUT, and a decoupling capacitor mounted on the second test substrate;
a plurality of inter-board connectors configured to electrically connect the first board to the plurality of second boards, each inter-board connector including a lower connector coupled to the first test substrate and an upper connector coupled to one second test substrate,
wherein the first test substrate includes
a first conductive layer,
a first connection pad connected to one lower connector of a single inter-board connector of the plurality of inter-board connectors,
a first conductive via configured to connect the first conductive layer to the first connection pad,
a second connection pad connected to a socket pin of any one first socket of the plurality of first sockets, and
a second conductive via configured to connect the first conductive layer to the second connection pad, and wherein each second test substrate of each second board of the plurality of second boards includes
a second conductive layer,
a third connection pad connected to a respective upper connector of a respective inter-board connector of the plurality of inter-board connectors,
a third conductive via configured to connect the second conductive layer to the third connection pad,
a fourth connection pad connected to a socket pin of a respective second socket of the respective second board, and
a fourth conductive via configured to connect the second conductive layer to the fourth connection pad,
wherein one of the lower connector or the upper connector includes a groove, and the other one of the lower connector or the upper connector includes a portion that is configured to be inserted into the groove such that the lower connector and the upper connector are coupled to each other, and
wherein the lower connector and the upper connector are configured to be separably coupled to each other based on the portion being inserted into the groove such that a respective second board is separably coupled to the first board.

* * * * *